(12) United States Patent
Frankowsky

(10) Patent No.: US 6,649,999 B2
(45) Date of Patent: Nov. 18, 2003

(54) SEMICONDUCTOR CHIP CONFIGURATION WITH A LAYER SEQUENCE WITH FUNCTIONAL ELEMENTS CONTACTED BY CONTACT PADS

(75) Inventor: Gerd Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/187,766

(22) Filed: Jul. 2, 2002

(65) Prior Publication Data

US 2003/0003744 A1 Jan. 2, 2003

(30) Foreign Application Priority Data

Jul. 2, 2001 (DE) .......................... 101 31 940

(51) Int. Cl.[7] .............................. H01L 29/00
(52) U.S. Cl. .................. 257/532; 257/533; 257/534; 257/535; 257/690
(58) Field of Search ................ 257/532, 533, 257/534, 535, 690

(56) References Cited

U.S. PATENT DOCUMENTS

| 4,685,998 A | 8/1987 | Quinn et al. |
| 5,789,303 A | 8/1998 | Leung et al. |
| 5,994,169 A | 11/1999 | Lamson et al. |

FOREIGN PATENT DOCUMENTS

| JP | 03 138 962 A | 6/1991 |
| JP | 11 145 394 A | 5/1999 |
| JP | 2000 323 664 A | 11/2000 |

OTHER PUBLICATIONS

Yasunaga, M. et al.: Chip Scale Package: "A Lightly Dressed LSI Chip", IEEE, vol. 18, No. 3, Sep. 1995, pp. 451–457.

*Primary Examiner*—Thien Tran
(74) *Attorney, Agent, or Firm*—Laurence A. Greenberg; Werner H. Stemer; Gregory L. Mayback

(57) ABSTRACT

In a semiconductor chip, conductive tracks run in a rewiring layer from contact pads to contact elevations. The contact pads are formed as vias. The conductive tracks are constructed in sections as bottom electrodes of trimming capacitors. The top electrode of the trimming capacitors is formed by a metal plane of the rewiring layer.

4 Claims, 4 Drawing Sheets

SEMICONDUCTOR CHIP CONFIGURATION WITH A LAYER SEQUENCE WITH FUNCTIONAL ELEMENTS CONTACTED BY CONTACT PADS

BACKGROUND OF THE INVENTION

Field of the Invention

The invention lies in the semiconductor technology field. More specifically, the invention relates to a semiconductor chip configuration with a substrate on which a layer sequence is constructed with functional elements that can be contacted by way of contact pads, whereby conductive tracks run in a rewiring layer from the pads to contact elevations.

The invention further relates to a method for constructing contacts on a semiconductor chip configuration.

Owing to the contact elevations, such semiconductor chips can be mounted directly on PCBs. The contact elevations contact the contacts on the PCB. Accordingly, the spacings between the contact elevations are selected so that they correspond to the spacings between the contacts on the PCB. On the semiconductor chip side, the contact elevations are connected in a rewiring layer to contact points (pads), which are connected to the functional elements in the layer sequence. Each conductive track leads from a respective contact elevation to a respective pad.

The pads are usually designed such that they are suitable for bonding and contacting with test cards which are equipped with pins. The contact pads consequently occupy a relatively large area of some 90 $\mu$m×90 $\mu$m.

In addition, trimming capacitors are arranged under the pads in the semiconductor chip, which serve to adapt the capacity of the pads to the prescribed specifications. A plurality of trimming capacitors are usually provided. The values for the capacity are adjusted by replacing the mask for a metal layer in a specified lithography step.

Conventional pads require an appreciable proportion of chip space. In addition, the trimming of the capacitors is difficult and is no longer possible after fabrication.

SUMMARY OF THE INVENTION

It is accordingly an object of the invention to provide a semiconductor chip configuration and a corresponding fabrication method, which overcomes the above-mentioned disadvantages of the heretofore-known devices and methods of this general type and which provides for an improved semiconductor chip configuration and an improved method for constructing contacts on it.

With the foregoing and other objects in view there is provided, in accordance with the invention, a semiconductor chip configuration, comprising:
- a substrate carrying a layer sequence with electronic functional elements and including a rewiring layer on the substrate;
- contact pads formed as vias connected to the functional elements;
- contact elevations;
- conductive tracks extending in the rewiring layer from the contact pads to the contact elevations;
- each of the conductive tracks widening in a portion remote from the respective the via to form a bottom electrode of a respective capacitor to which the via is connected; and
- the capacitor further including an insulation layer arranged over the bottom electrode, and a top electrode above the insulation layer.

In accordance with an added feature of the invention, the insulation layer and the bottom electrode are disposed between the substrate and the top electrode.

In accordance with an additional feature of the invention, the top electrodes of the capacitors form a contiguous metal layer.

In accordance with another feature of the invention, the top electrodes of the capacitors of the semiconductor chip configuration are connected to a common contact elevation.

With the above and other objects in view there is also provided, in accordance with the invention, a method of producing contacts in a semiconductor chip configuration, which comprises:
- constructing electronic functional elements on a substrate;
- forming vias for contacting the electronic functional elements;
- constructing conductive tracks in a rewiring layer connected to the vias, and connecting the conductive tracks to capacitors remote from the vias; and
- wherein the conductive tracks are widened into a widened portion to form a respective bottom electrode of the capacitors, and an insulation layer is formed over the respective widened portions of the conductive tracks, and a top electrode is formed thereabove.

Because the pads are constructed as vias, they occupy a negligible proportion of chip space, namely 0.005%, as opposed to 0.6% in the prior art. Furthermore, the trimming capacitors are no longer located in the functional layers or in the wiring layers within the chip which adjoin the functional layers; rather, they are located in the rewiring planes over the functional layers, and consequently additional space is opened up in the underlying wiring planes and functional planes.

In a preferred embodiment of the invention, the capacitors that are allocated to the conductive tracks are constructed such that an electrode of the capacitors is positioned on the surface of the semiconductor chip.

The advantage of this configuration is that the electrode on the surface of the semiconductor chip can be post-trimmed. In other words, the top electrodes can configured to respectively adapt the capacitor to a predetermined capacitance value. Specifically, the capacitors can be trimmed subsequent to a function test of the functional elements.

Other features which are considered as characteristic for the invention are set forth in the appended claims.

Although the invention is illustrated and described herein as embodied in a semiconductor chip configuration and a fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
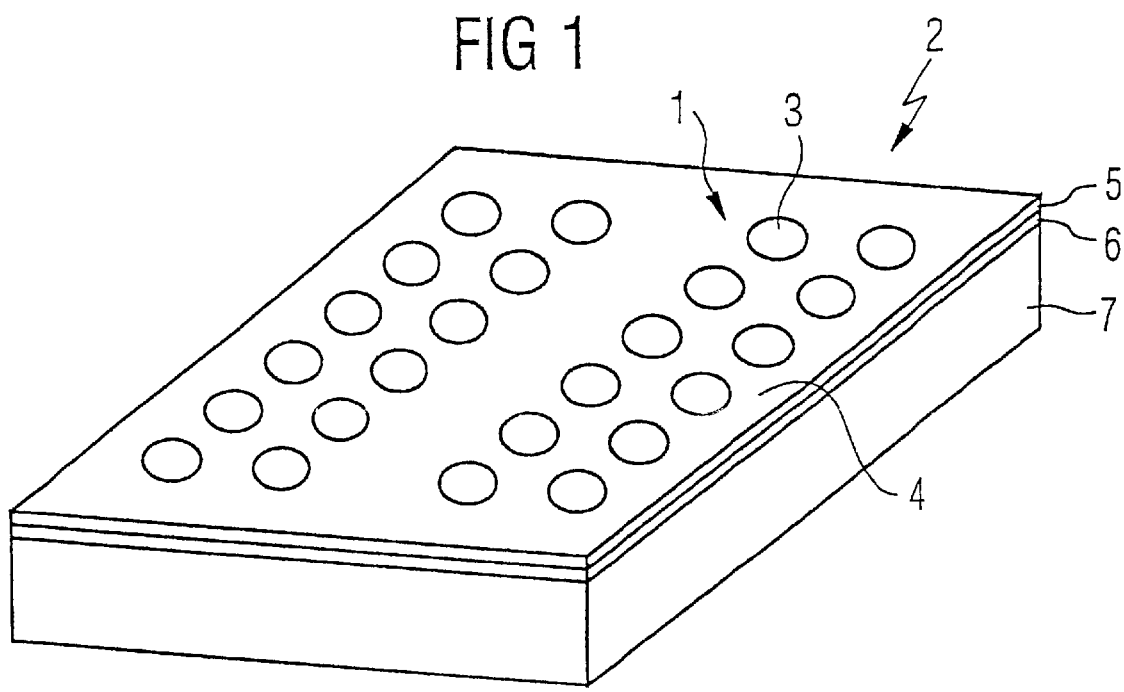
FIG. 1 is a perspective view of a contact side of a semiconductor chip.

Referring now to the figures of the drawing in detail and first, particularly, to FIG. 1 thereof, there is shown a perspective view of a contact side 1 of a semiconductor chip 2 on whose contact side 1 are contact elevations 3. In the present case, the contact elevations 3 are shaped approximately like truncated cones. The contact elevations 3 are arranged over an insulation layer 4 which is located on a rewiring layer 5. The rewiring layer 5 is above functional layers 6, which are disposed on a substrate 7 in turn. The substrate 7 and the functional layers 6 are disposed in a common semiconductor body. The rewiring layer 5 is an additional layer which is separate from the semiconductor body.

Figure 2:
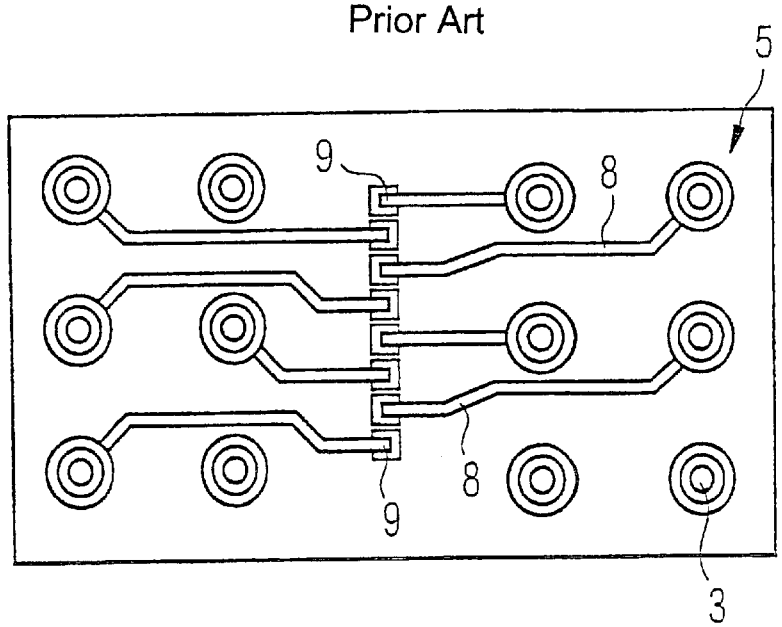
FIG. 2 is a plan view of the contact side from FIG. 1 with the conductive tracks known from the prior art.

FIG. 2 represents a plan view of the rewiring layer 5 underneath the insulation layer 4. In the rewiring layer 5, conductive tracks 8 lead from contact elevations 3 to pads 9. The functional elements such as transistors, capacitors or resistors which are constructed in the functional layers 6 of the semiconductor chip 2 can be contacted by way of the pads 9. The placement of the contact pads 9 is predetermined by the placement of the functional elements in the functional layer 6 and is not completely freely selectable. Fastening the semiconductor chip 2 on a PCB often requires contacts in a different configuration than that of the pads 9. The pads are therefore connected at the contact elevations 3, whose placement corresponds to the placement of contacts on the PCBs, with the aid of conductive tracks 8.

Figure 3:
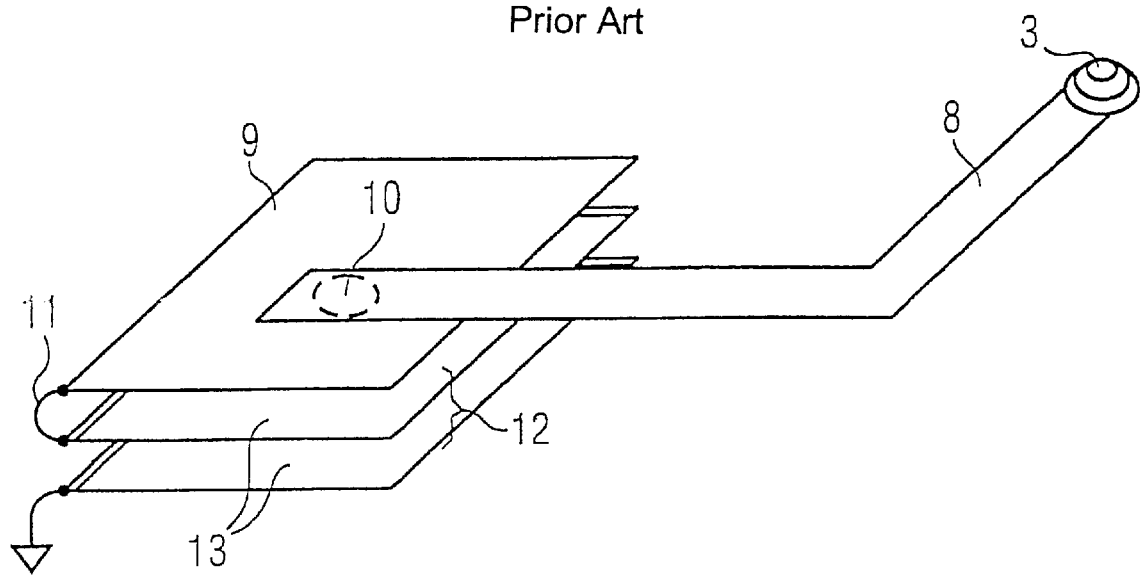
FIG. 3 is a perspective representation of the pads that are known from the prior art.

FIG. 3 represents a perspective view of conventional prior art pads. As described above, the pads 9 are connected to the contact elevations 3 with the aid of conductive tracks 8. At the center of the pads 9 are vias 10, by means of which a connection 11 is produced between the pads 9 arranged on the level of the rewiring layer and the functional elements below these on the level of the functional layer 6. The term via or via hole refers to a through hole from one layer plane to another layer plane above or below the former.

Trimming capacitors 12 are also connected to the pads 9. FIG. 3 represents one of the trimming capacitors 12, specifically its two electrodes 13. According to FIG. 4, a plurality of the trimming capacitors 12 are connected in parallel fashion. The trimming capacitors 12 serve for setting the capacity values of the contact pads 9, the conductive track 8, and the contact elevations 3 in accordance with the specifications for the semiconductor chip 2. In order to connect the trimming capacitor 12 to or separate it from the pad 9, exposure masks for structuring a metal layer in the functional layers 6 must be so selected in a lithography step that bridges 14 are set up according to the desired capacity values. The capacitors are located under the contact pads.

Figure 4:
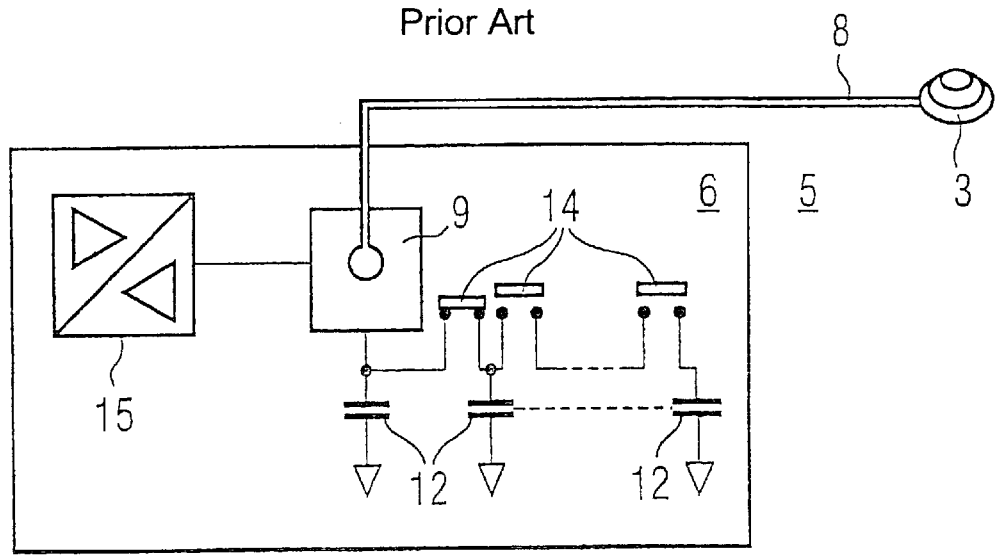
FIG. 4 is a block circuit diagram of the prior art pads.

FIG. 4 further illustrates a drive circuit 15 as an example of the functional elements in the functional layer 6.

The disadvantage of conventionally constructed pads 9 is that they occupy a significant proportion of chip space. The space taken up by the pads 9 is lost to the functional elements in the functional layers 6. Besides this, it is expensive and complicated to set up the bridges 14 with the aid of the exposure masks.

Figure 5:
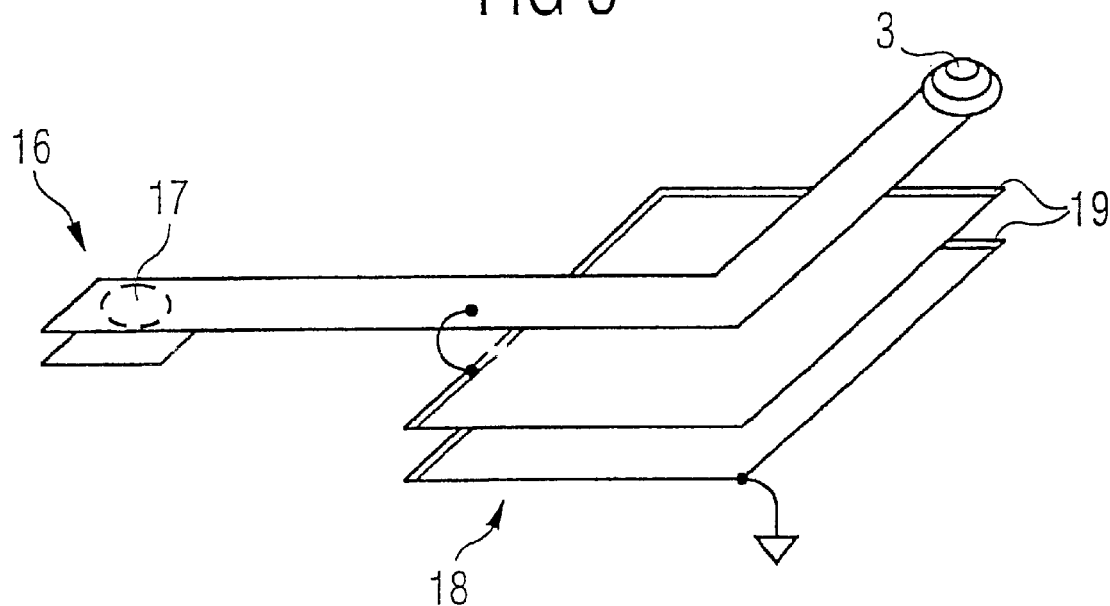
FIG. 5 is a perspective view of the pads with the conductive tracks connected to them.
Figure 6:
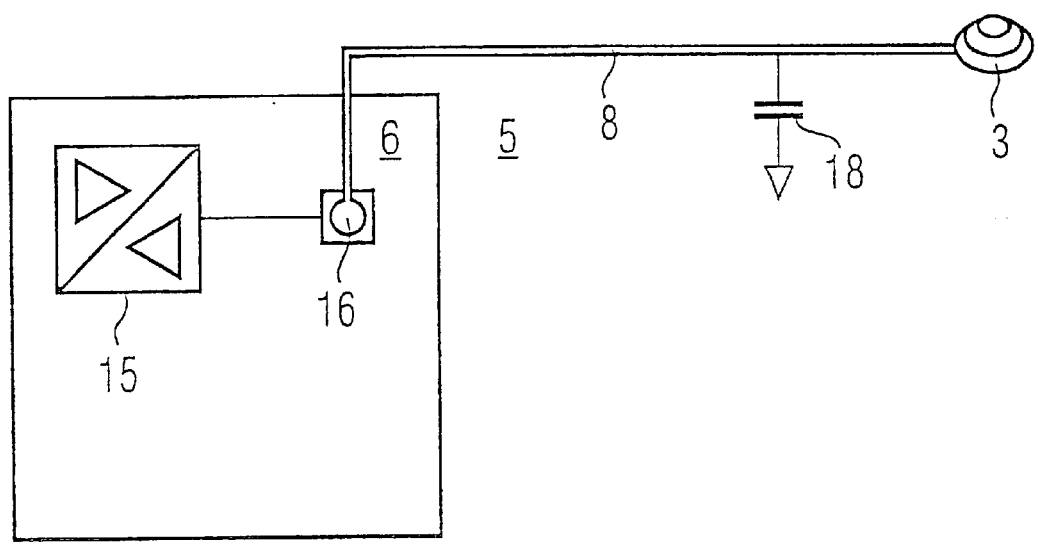
FIG. 6 is a block circuit diagram of the pads according to the invention.

According to the invention, the pads 16 are constructed as vias 17. The conductive track leads from these pads 16 to the contact elevations as in the prior art. For trimming the capacity of the pads 16, the conductive tracks 8, and the contact elevations 3, trimming capacitors 18 which are connected to the track 8 are provided in the rewiring layer 5. For the sake of simplicity, FIG. 5 includes only a single trimming capacitor 18 with its two electrodes 19.

It is advantageous to construct the trimming capacitors in the rewiring layer 5, because the vias 17 occupy a negligible proportion of chip space in the functional layers 6. In the case of an SDRAM memory chip with 256 Mbits of memory (256M SDRAM), the conventional pads 9 take up approx. 0.6% of the total chip area. The same amount of vias 17 requires only 0.005% of the chip area. Given their small space requirement, the vias 17 can be arranged wherever they are needed in the functional layer 6. Greater freedom in designing the functional layers 6 is thus created when the contact pads 16 are constructed as vias 17. The trimming capacitors 18 can also still be set or trimmed to the required capacity values during testing. For instance, laser trimming can be applied.

Figure 7:
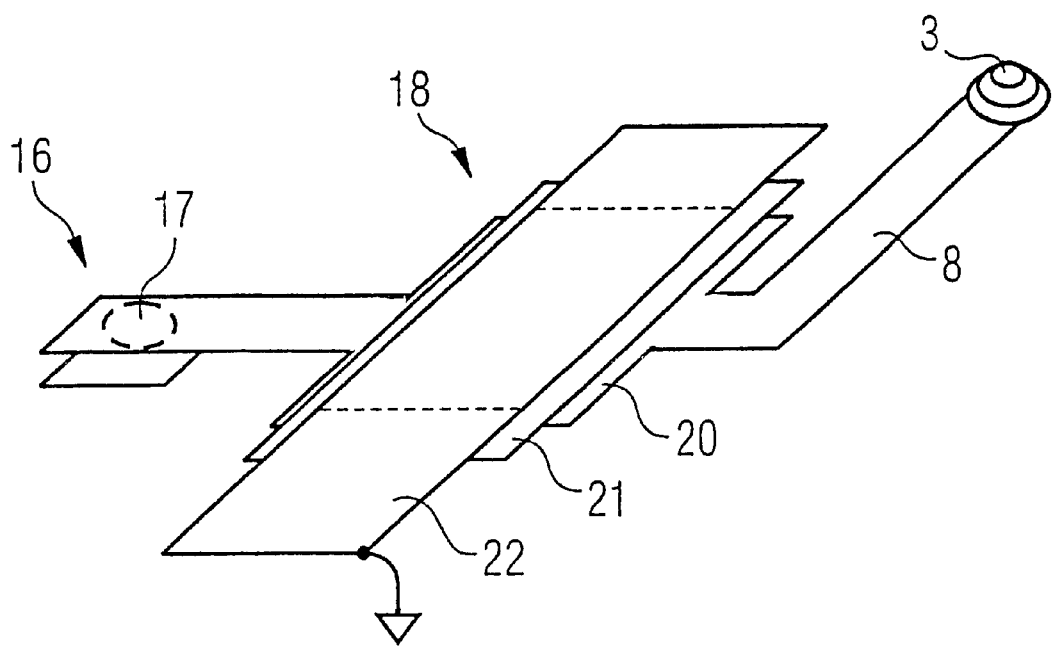
FIG. 7 is a perspective view of an exemplary embodiment of the invention.

This specific case is represented in FIG. 7. In this exemplary embodiment, the conductive track 8 is widened in sections into a bottom electrode 20, which is separated from a top electrode 22 by an insulation layer 21. The top electrode 22 is located directly below the insulation layer 4, so that the electrodes 22 can still be processed after the rewiring layer 5 has been produced. This is advantageous particularly when the capacity values of the trimming capacitors 18 must still be modified after the actual semiconductor chip 2 is finished.

Figure 8:
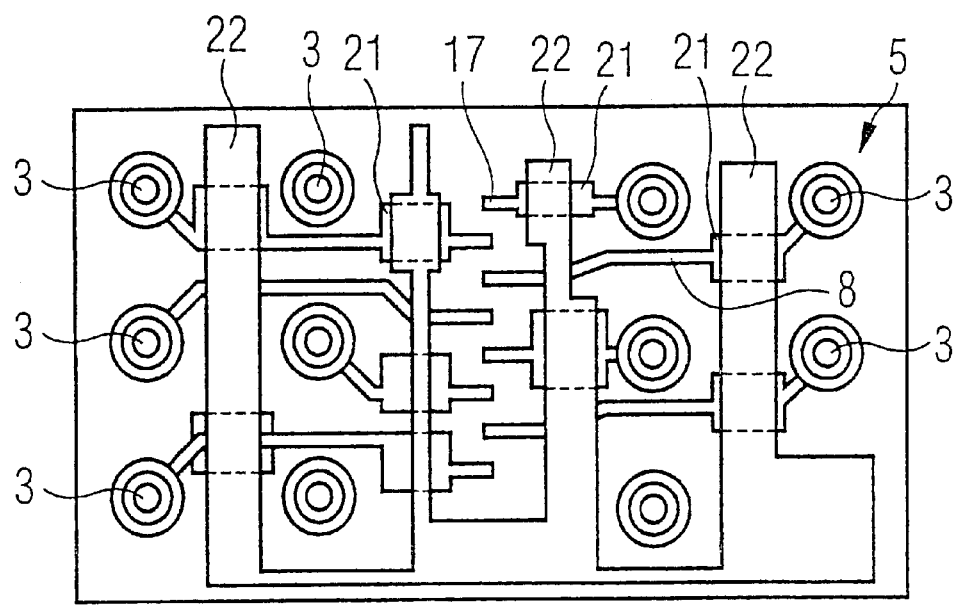
FIG. 8 is a plan view of the contact side of a semiconductor chip according to the invention.

Expediently, the top electrodes 22 represent portions of a metal plane of the rewiring layer 5 as represented in FIG. 8. FIG. 8 represents various planes of the rewiring layer 5 from above. It is evident that the top electrodes 22 form a contiguous metal layer which is connected to one of the contact elevations 3. Moving the trimming capacitors 18 from the functional layers 6 into the rewiring layer 5 makes it possible to construct the contact pads 16 as vias 17. This produces greater flexibility in designing the functional layer. Furthermore, the trimming capacitors 18 can be modified even after the functional layers 6 are finished, for instance by trimming the top electrodes of the capacitors.

I claim:

1. A semiconductor chip configuration, comprising:
   a substrate carrying a layer sequence with electronic functional elements and including a rewiring layer on said substrate;
   contact pads formed as vias connected to said functional elements;
   contact elevations;
   conductive tracks extending in said rewiring layer from said contact pads to said contact elevations;
   a plurality of capacitors;
   each of said conductive tracks widening in a portion remote from the respective said via to form a bottom electrode of a respective capacitor of said plarality of capacitors to which said via is connected; and
   said respective capacitor further including an insulation layer arranged over said bottom electrode, and a top electrode above said insulation layer.

2. The semiconductor chip configuration according to claim 1, wherein said insulation layer and said bottom electrode are disposed between said substrate and said top electrode.

3. The semiconductor chip configuration according to claim 1, wherein said top electrodes of said capacitors form a contiguous metal layer.

4. The semiconductor chip configuration according to claim 1, wherein said top electrodes of the capacitors of the semiconductor chip configuration are connected to a common contact elevation.

* * * * *